(12) United States Patent
Maeda et al.

(10) Patent No.: US 8,609,995 B2
(45) Date of Patent: Dec. 17, 2013

(54) MULTILAYER WIRING BOARD AND MANUFACTURING METHOD THEREOF

(75) Inventors: Shinnosuke Maeda, Nagoya (JP); Satoshi Hirano, Chita-gun (JP); Yuuki Shiiba, Komaki (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 178 days.

(21) Appl. No.: 13/184,661

(22) Filed: Jul. 18, 2011

(65) Prior Publication Data

US 2012/0018194 A1    Jan. 26, 2012

(30) Foreign Application Priority Data

Jul. 22, 2010    (JP) ................................ 2010-165397

(51) Int. Cl.
*H05K 1/00*    (2006.01)

(52) U.S. Cl.
USPC ............................ 174/258; 174/251; 174/255

(58) Field of Classification Search
USPC .................. 174/251, 263, 250, 255, 256, 258; 438/118
See application file for complete search history.

(56) References Cited

U.S. PATENT DOCUMENTS

| | | | |
|---|---|---|---|
| 5,882,954 A * | 3/1999 | Raghava et al. | 438/119 |
| 5,962,925 A * | 10/1999 | Eifuku et al. | 257/778 |
| 6,251,502 B1 * | 6/2001 | Yasue et al. | 428/209 |
| 6,413,620 B1 * | 7/2002 | Kimura et al. | 428/210 |
| 6,674,017 B1 | 1/2004 | Yamasaki et al. | |
| 8,129,623 B2 * | 3/2012 | Nagasawa et al. | 174/255 |
| 2009/0126981 A1 | 5/2009 | Horiuchi et al. | |

FOREIGN PATENT DOCUMENTS

| | | |
|---|---|---|
| JP | 2000-244127 A | 9/2000 |
| JP | 2009-117703 A | 5/2009 |

OTHER PUBLICATIONS

Shinji et al., JP 2007-096291, 2007, Japan, (english translation).*

* cited by examiner

*Primary Examiner* — Hoa C Nguyen
*Assistant Examiner* — Paresh Paghadal
(74) *Attorney, Agent, or Firm* — Stites & Harbison PLLC; Jeffrey A. Haeberlin; Nicolo Davidson

(57) ABSTRACT

Disclosed is a manufacturing method of a multilayer wiring board. The multilayer wiring board includes an outer resin insulation layer made of an insulating resin material, containing a filler of inorganic oxide and having an outer surface defining a chip mounting area to which an electronic chip is mounted with an underfill material filled in between the outer resin insulation layer and the electronic chip and holes through which conductor parts are exposed. The manufacturing method includes a hole forming step of forming the holes in the outer resin insulation layer by laser processing, a desmear treatment step of, after the hole forming step, removing smears from inside the holes of the outer resin insulation layer, and a filler reducing step of, after the desmear treatment step, reducing the amount of the filler exposed at the outer surface of the outer resin insulation layer.

16 Claims, 5 Drawing Sheets

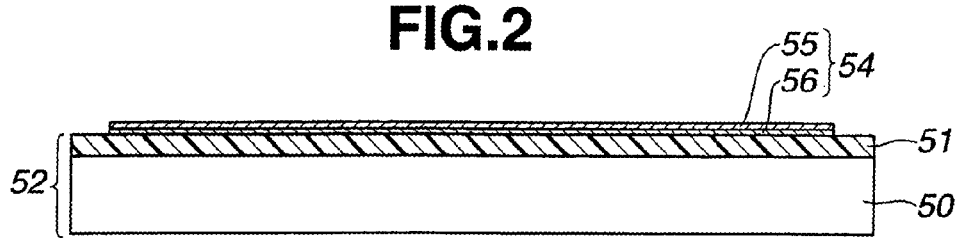
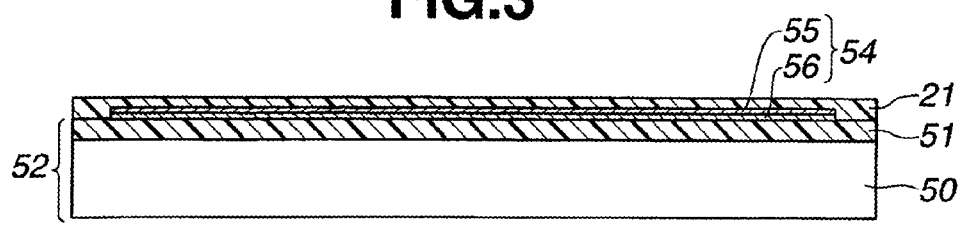
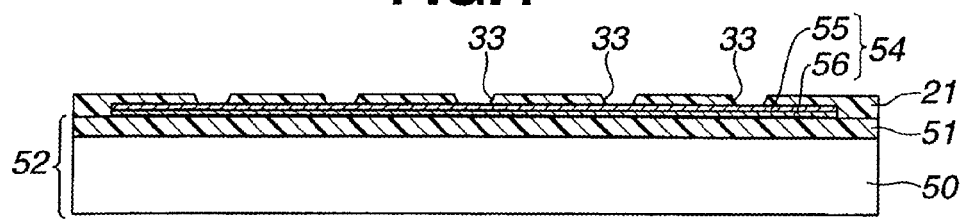
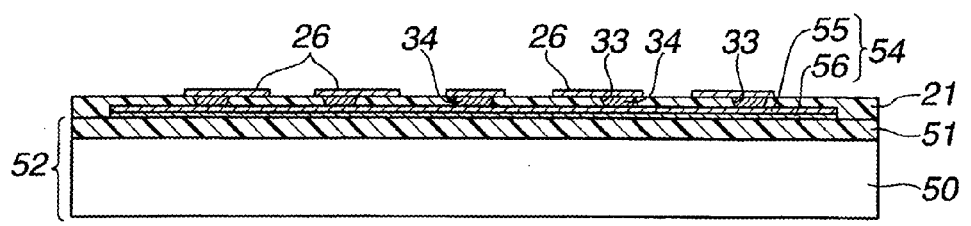
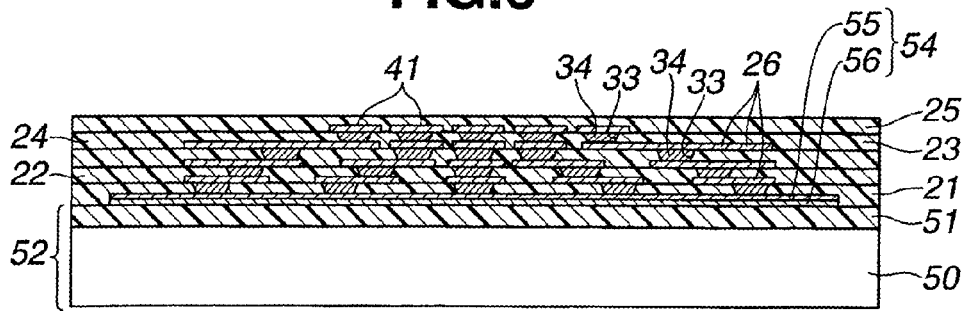

MULTILAYER WIRING BOARD AND MANUFACTURING METHOD THEREOF

BACKGROUND OF THE INVENTION

The present invention relates to a multilayer wiring board in which a plurality of resin insulation layers and conduction layers are alternately laminated on each other and a manufacturing method thereof.

A semiconductor integrated circuit chip (hereinafter referred to as "IC chip") has various applications such as a microprocessor for a computer. In recent years, there has been a tendency to provide an increasing number of terminals on the IC chip with a smaller terminal pitch for higher operation speed and performance of the IC chip. These plurality of terminals are generally arranged close to each other in an array on a bottom side of the IC chip and are connected by flip-chip bonding to terminals of a motherboard. However, the direct mounting of the IC chip on the motherboard is difficult due to a great difference between the terminal pitch of the IC chip and the terminal pitch of the motherboard. It is thus common practice to produce a semiconductor package by mounting the IC chip on a chip mounting wiring board, and then, mount the semiconductor package on the motherboard.

As the chip mounting wiring board of the semiconductor package, there has been put into practical use a multilayer wiring board in which a plurality of build-up layers are formed on top and bottom sides of a core substrate. The multilayer wiring board utilizes as the core substrate, for example, a resin substrate formed of resin-impregnated glass fiber material (e.g. glass/epoxy resin) and made much larger in thickness than the build-up layers so as to attain high rigidity and function as a reinforcement. Further, electrical wiring (e.g. through-hole conductors) is formed through the core substrate for electrical connection between the build-up layers on the top and bottom sides of the core substrate.

For high-speed operation of the IC chip, high-frequency signals have recently been applied to the IC chip. In this case, the mounting of the IC chip on the build-up wiring board results in a transmission loss of the high-frequency signal or a circuit malfunction of the IC chip and becomes a cause of interference with the high-speed operation of the IC chip as the electrical wiring produces a high inductance in the core substrate. As a solution to such a problem, Japanese Laid-Open Patent Publication No. 2009-117703 (abbreviated as "JP 2009-117703A") proposes a coreless multilayer wiring board that has no core substrate of relatively large thickness so as to shorten the total wiring length of the multilayer wiring board and reduce the transmission loss of high-frequency signals for high-speed operation of the IC chip.

In JP 2009-117703A, the build-up layers are provided with alternating resin insulation layers and conduction layers. The resin insulation layers, including not only an outer resin insulation layer as the outermost build-up layer but also inner resin insulation layers as the inner build-up layers, are formed of the same resin material, whereas the conduction layers are formed by e.g. plating on the resin insulation layers. In this type of multilayer wiring board, a silica filler is commonly added to the resin insulation layers in order to improve the adhesion of the resin insulation layers to the conduction layers and to decrease the thermal expansion coefficient of the resin insulation layers. Further, connection terminals are formed in the outer resin insulation layer and connected by flip-chip bonding via solder bumps to the IC chip; and an underfill material of liquid curable resin is filled in a clearance between the outer resin insulation layer and the IC chip in order to improve the thermal fatigue life of the solder bumps.

SUMMARY OF THE INVENTION

However, the silica filler contained in the outer resin insulation layer gets exposed at a surface of the outer resin insulation layer and deteriorates the flowability of the underfill material. More specifically, the silica filler produces a higher resistance to the flow of the underfill material, as the amount of the silica filler exposed at the surface of the outer resin insulation layer increases, due to the facts that: the resin insulation layer and the underfill material is hydrophobic; and the silica filler is hydrophilic. There thus arise problems that: it takes a longer time for the underfill material to be filled throughout the clearance between the outer resin insulation layer and the IC chip; and voids occur in the clearance between the outer resin insulation layer and the IC chip.

In view of the foregoing, it is an object of the present invention to provide a multilayer wiring board that has an outer resin insulation layer as an outermost build-up layer defining thereon a chip mounting area on which an electronic chip is mounted such that an underfill material can properly and assuredly seal a clearance between the outer resin insulation layer and the electronic chip and a manufacturing method thereof.

According to one aspect of the present invention, there is provided a manufacturing method of a multilayer wiring board, the multilayer wiring board comprising a laminated wiring portion having a plurality of resin insulation layers and conduction layers alternately laminated on each other, the resin insulation layers including an outer resin insulation layer as the outermost layer of the laminated wiring portion and an inner resin insulation layer as the inner layer of the laminated wiring portion, the outer resin insulation layer being made of the same insulation resin material as the inner resin insulation layer, containing an filler of inorganic oxide and having an outer surface defining thereon a chip mounting area to which an electronic chip is mounted with an underfill material filled in a clearance between the outer resin insulation layer and the electronic chip and holes through which conductor parts are exposed, the manufacturing method comprising: a hole forming step of forming the holes in the outer resin insulation layer by laser processing; a desmear treatment step of, after the hole forming step, removing smears from inside the holes of the outer resin insulation layer; and a filler reducing step of, after the desmear treatment step, reducing the amount of the filler exposed at the outer surface of the outer resin insulation layer.

According to another aspect of the present invention, there is provided a multilayer wiring board, comprising: a laminated wiring portion having a plurality of resin insulation layers and conduction layers alternately laminated on each other, the resin insulation layers including an outer resin insulation layer as the outermost layer of the laminated wiring portion and an inner resin insulation layer as the inner layer of the laminated wiring portion, the outer resin insulation layer being made of the same insulating resin material as the inner resin insulation layer, containing a filler of inorganic oxide and having an outer surface defining thereon a chip mounting area to which an electronic chip is mounted with an underfill material filled in a clearance between the outer resin insulation layer and the electronic chip, wherein the amount of the filler present at the outer surface of the outer resin insulation layer is lower than the amount of the filler present inside of the outer resin insulation layer.

The other objects and features of the present invention will also become understood from the following description.

BRIEF DESCRIPTION OF THE DRAWINGS

FIGS. 2 to 9 are schematic views showing process steps for manufacturing the multilayer wiring board according to the one embodiment of the present invention.

DESCRIPTION OF THE EMBODIMENTS

Figure 1:
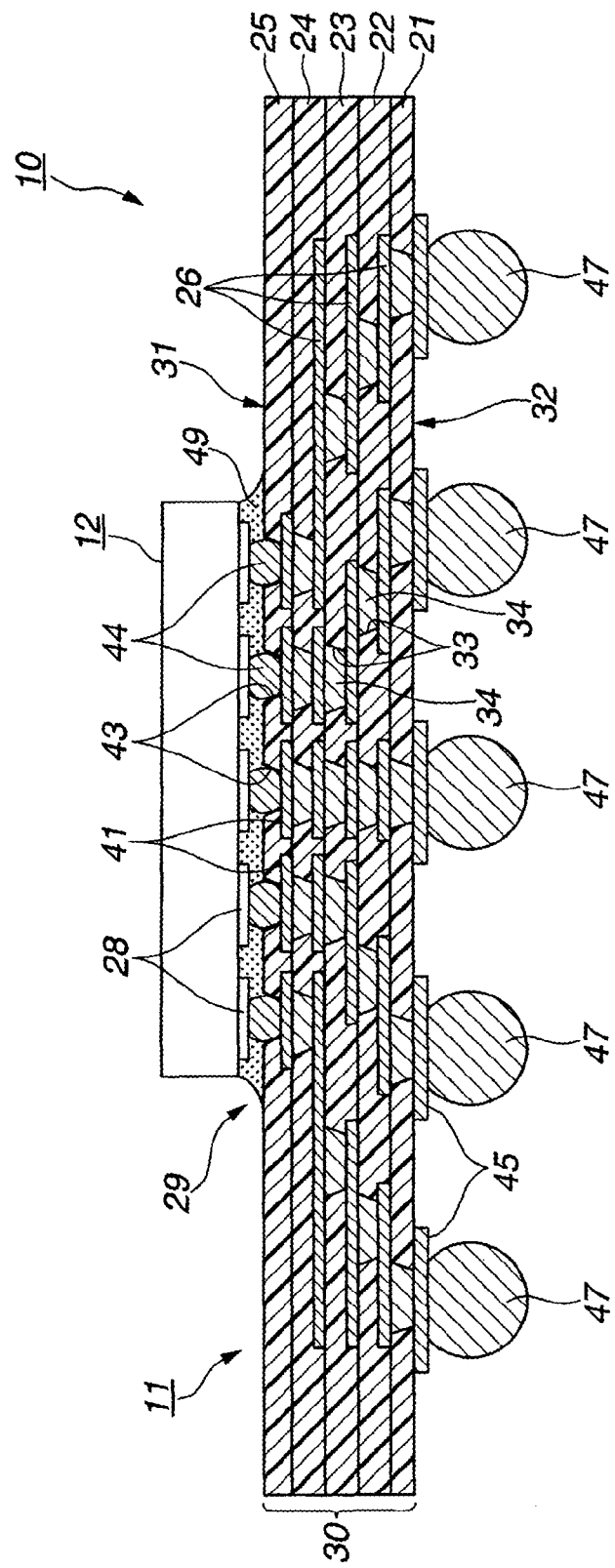
FIG. 1 is a schematic section view of a semiconductor package with a multilayer wiring board according to one embodiment of the present invention.

The present invention will be described in detail below by way of the following embodiments, in which like parts and portions are designated by like reference numerals to avoid repeated explanations thereof. It is herein noted that, in the following description, the directional terms such as "top" and "bottom" are used for illustration purposes only and are not intended to limit the present invention to any particular orientation.

Referring to FIG. 1, a semiconductor package 10 according to one embodiment of the present invention has a ball grid array (BGA) configuration including a multilayer wiring board 11 and an IC chip 12. The configuration of the semiconductor package 10 is not however limited to the BGA configuration. The semiconductor package 10 may alternatively have a pin grid array (PGA) configuration, a land grid array (LGA) configuration or any other configuration.

The form of the IC chip 12 is not particularly limited. The IC chip 12 can be a DRAM (Dynamic Random Access Memory) or a SRAM (Static Random Access Memory) for use as a microprocessor in a computer. Although the IC chip 12 is mounted on the multilayer wiring board 11 in the present embodiment, another type of electronic chip such as a chip condenser, a MEMS (Micro Electro Mechanical System) or any other chip component e.g. a chip transistor, a chip diode, a chip resistor, a chip coil, a chip inductor etc. may be used in place of the IC chip.

The multilayer wiring board 11 is designed as a coreless wiring board with no core substrate in the present embodiment. As shown in FIG. 1, the multilayer wiring board 11 has a laminated wiring portion 30 (as a laminated structure) with top and bottom main surfaces 31 and 32. A chip mounting area 29, to which the IC chip 12 is mounted, is provided on the top surface 31 of the laminated wiring portion 30. The laminated wiring portion 30 includes resin insulation layers 21, 22, 23, 24 and 25 and conduction layers 26 alternately laminated as build-up layers on each other. Herein, the resin insulation layer 25 exposed as the outermost build-up layer at the top surface 31 of the laminated wiring portion 30 is occasionally referred to as "outer resin insulation layer"; and the resin insulation layers 22, 23 and 24 provided as the inner build-up layer inside of the laminated wiring portion 30 are occasionally referred to as "inner resin insulation layers". The outer resin insulation layer 25 has a top (outer) surface defining thereon the chip mounting area 29 and a bottom (inner surface) facing toward the adjacent inner resin insulation layer 24. In the present embodiment, the outer resin insulation layer 25 functions as a solder resist and have a plurality of holes formed therein by laser processing so that conductor parts are exposed at the chip mounting area 29 through the holes 43.

The resin insulation layers 21 to 25 are formed of the same insulating resin material. As the outer resin insulation layer 25 is formed of the same insulating resin material as the inner resin insulation layers 22 to 24, it is possible to reduce the influence of the difference in thermal expansion coefficient between the outer resin insulation layer 25 and the inner resin insulation layers 22 to 24 and thereby possible to prevent warpage of the multilayer wiring board 11 effectively as compared to the case where the outer resin insulation layer 25 is formed of a different material from the inner resin insulation layers 22 to 24.

The resin material of the resin insulation layers 21 to 25 can be selected as appropriate in terms of the electrical resistance, heat resistance, moisture resistance etc. required of the resin insulation layers 21 to 25. Suitable examples of the resin material of the resin insulation layers 21 to 25 are: thermosetting resins such as epoxy resins, phenol resins, urethane resins, silicone resins and polyimide resins; and thermoplastic resins such as polycarbonate resins, acrylic resins, polyacetal resins and polypropylene resins.

Further, a filler is added to each of the resin insulation layers 21 to 25. Examples of the filler are those of inorganic oxides such as silica, titania and alumina. Among others, a silica filler is preferred because of its low dielectric constant and low linear expansion coefficient. The quality of the multilayer wiring board 11 can be improved with the addition of such a silica filler to the resin insulation layers 21 to 25.

In the present embodiment, the resin insulation layers 21 to 25 are formed of insulating resin material, called build-up material, containing a thermosetting epoxy resin (uncurable with light radiation) as a main component and a silica filler as an additive.

On the other hand, the conduction layers 26 are formed of e.g. copper by any known circuit formation process such as subtractive process, semi-additive process or full-additive process in the present embodiment.

The multilayer wiring board 11 has a plurality of connection terminals 41 and 45 and solder bumps 44 and 47 formed on the connection terminals 41 and 45, respectively. The connection terminals 41 are arranged in an array, exposed at the chip mounting area 29 of the top surface 31 of the laminated wiring portion 30 through the respective holes 43 of the outer resin insulation layer 25 and electrically connected to surface contact terminals 28 of the IC chip 21 via the solder bumps 44. The connection terminals 45 are arranged in an array on the bottom surface 32 of the laminated wiring portion 30 and electrically connected to a motherboard via the solder bumps 47.

The multilayer wiring board 11 also has a plurality of via holes 33 formed in the resin insulation layers 21 to 24 and via conductors 34 formed in the via holes 33 for electrical connection of the conduction layers 26 to the connection terminals 41 and 45. Each of the via holes 33 is shaped into a frustum of a cone and tapered down toward the bottom surface 32 of the laminated wiring portion 30. These via holes 33 can be formed by laser processing on the resin insulation layers 21 to 24. Each of the via conductors 34 corresponds in shape to the via hole 33 so as to gradually increases in diameter toward the top surface 31 of the laminated wiring portion 30.

Referring again to FIG. 1, the semiconductor package 10 includes an underfill material 49 filled in a clearance between the outer resin insulation layer 25 and the IC chip 12 so as to seal the connection points between the multilayer wiring board 11 and the IC chip 12 (notably, the connection terminals 41, the solder bumps 44 and the surface contact terminals 28) with the underfill material 49.

As will be discussed later, some of particles 57 of the filler get exposed at the top (outer) surface of the outer resin insulation layer 25 during manufacturing (see e.g. FIG. 7). In the present embodiment, the amount of the filler present at the top surface of the outer resin insulation layer 25 is made lower than the amount of the filler present inside of and at the bottom surface of the outer resin insulation layer 25. It is thus possible to secure the flowability of the underfill material 49 on the top surface of the outer resin insulation layer 25 so that the underfill material 49 can properly and assuredly seal the clearance between the outer resin insulation layer 25 and the IC chip 12 in a short time and without causing voids.

The multilayer wiring board 11 and the semiconductor package 10 can be manufactured by the following procedures.

First, a support substrate 50 of sufficient strength, such as a glass/epoxy substrate, is prepared. The resin insulation layers 21 to 25 and the conduction layers 26 are built up on the support substrate 50, thereby forming the laminated wiring portion 30.

More specifically, a substrate medium 52 is formed by bonding a sheet of insulating resin base material such as epoxy resin as a resin insulation base coat layer 51 to the support substrate 50 as shown in FIG. 2. A laminated metal sheet 54 is then placed on the base coat layer 51 of the substrate medium 52. In the present embodiment, the laminated metal sheet 54 has two copper foil films 55 and 56 detachably laminated together by e.g. metal plating such as chromium plating, nickel plating, titanium plating or composite plating thereof. Upon placement of such a laminated metal sheet 54 on the base coat layer 51, there is developed adhesion between the base coat layer 51 and the laminated metal sheet 54 so that the laminated metal sheet 54 would not become separated from the base coat layer 51 during the subsequent process steps.

As shown in FIG. 3, the resin insulation layer 21 is prepared in sheet form, placed on the substrate medium 52 so as to cover the laminated metal sheet 54, and then, bonded to the substrate medium 52. The laminated metal sheet 54 is sealed with the resin insulation layer 21 as the resin insulation layer 21 is adhered to not only the laminated metal sheet 54 but also part of the base coat layer 51 around the laminated metal sheet 54.

The via holes 33 are formed at given positions in the resin insulation layer 21 by laser processing using e.g. an excimer laser, a UV laser or a $CO_2$ laser as shown in FIG. 4. Subsequently, smears are removed from the via holes 33 by desmear treatment with an etching solution such as potassium permanganate solution. Alternatively, the desmear treatment may be performed by plasma ashing with e.g. $O_2$ plasma.

After the desmear treatment, the via conductors 34 are formed in the via holes 33 by applying electroless copper plating and electrolytic copper plating to the via holes 33. The electroless copper plating and the electrolytic copper plating can be applied by any conventionally known techniques. The resulting copper plating film is etched by any known process such as semi-additive process, thereby patterning the conduction layer 26 on the resin insulation layer 21 as shown in FIG. 5. Alternatively, the conduction layer 26 can be formed by applying a thin copper film by sputtering or chemical vapor deposition (CVD) and then subjecting the thin copper film or copper foil to etching, or by printing a conductive copper paste.

The resin insulation layers 22 to 25, the other conduction layers 26 and the connection terminals 41 are successively formed in the same manner as above as shown in FIG. 6.

After that, a hole forming step, a desmear treatment step, a filler reducing step and a thermal curing step are successively performed in the present embodiment.

In the hole forming step, the holes 43 are formed in the outer resin insulation layer 25 by laser processing so that the connection terminals 41 are exposed through the holes 43.

Figure 7:
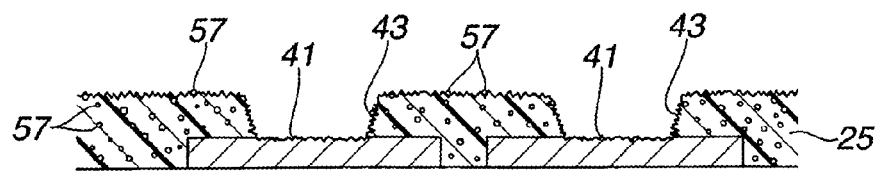

Next, smears are removed from the holes 43 by desmear treatment with e.g. a potassium permanganate solution or $O_2$ plasma in the desmear treatment step as shown in FIG. 7. By the desmear treatment step, the top surface of the outer resin insulation layer 25 and wall surfaces of the holes 43 are finely roughened; and some of the filler particles 57 are exposed at the top surface of the outer resin insulation layer 25 and the wall surfaces of the holes 43.

In the filler reducing step after the desmear treatment step, cleaning treatment is performed to reduce the amount of the filler exposed at the top surface of the outer resin insulation layer 25 and the wall surfaces of the holes 43 for improvement in the flowability of the underfill material 49.

Figure 8:
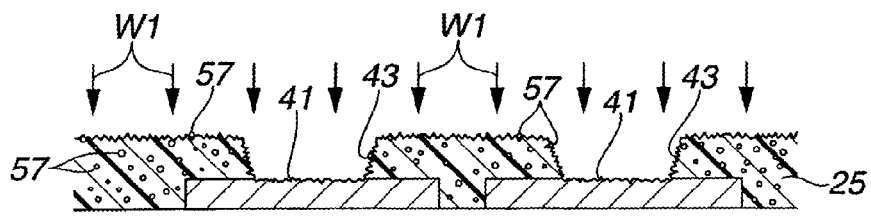

One effective way of the cleaning treatment is high-pressure water cleaning by which high-pressure water W1 is ejected to the outer resin insulation layer 25 to clean the filler from the top surface of the outer resin insulation layer 25 as shown in FIG. 8. For assured cleaning and reduction of the filler, the pressure of the high-pressure water W1 is preferably 100 kgf/cm$^2$ or higher, more preferably 300 kgf/cm$^2$ or higher. It is further preferable to perform the high-pressure water cleaning continuously for 1 minute or more at room temperature for assured cleaning and reduction of the filler. In the present embodiment, the high-pressure water cleaning is performed by continuously ejecting the high-pressure water W1 for about 2 minutes at 500 kgf/cm$^2$ and at room temperature.

Figure 9:
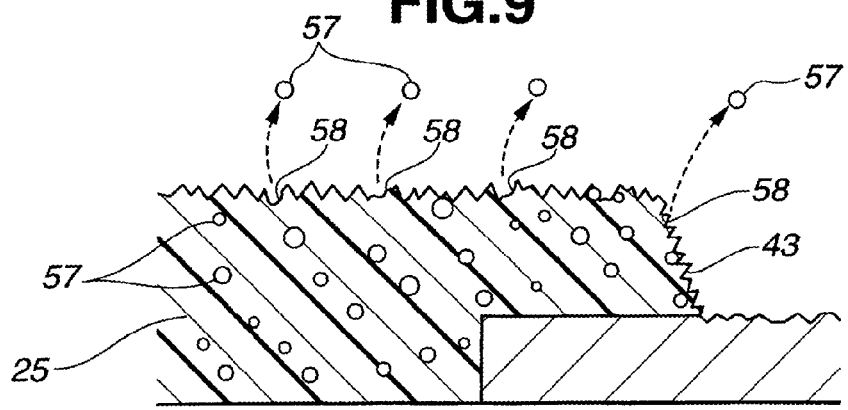

By the high-pressure water cleaning treatment, the filler particles 57 having a large surface (e.g. half or more of the area of the particle surface) exposed at the top surface of the outer resin insulation layer 25 are washed away. As a result of removal of the filler particles 57, there are formed recesses 58 in the top surface of the outer resin insulation layer 25 as shown in FIG. 9. On the other hand, the filler particles 57 deeply embedded in the outer resin insulation layer 25 remain exposed at the top surface of the outer resin insulation layer 25. The amount of the filler particles 57 present (remaining) and exposed at the top surface of the outer resin insulation layer 25 can be thus reduced efficiently to a lower level than the amount of the filler particles 57 present (remaining) inside of and at the bottom surface of the outer resin insulation layer 25 so as to improve the flowability of the underfill material 49 on the top surface of the outer resin insulation layer 25.

Figure 10:
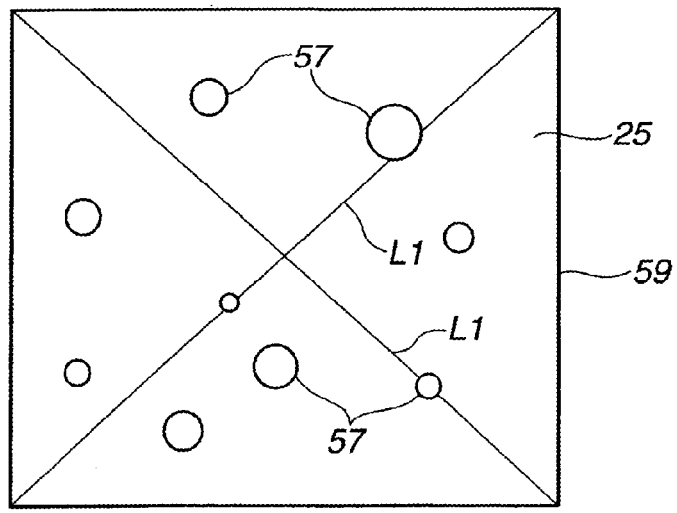
FIG. 10 is a schematic view showing a scanning electron microscope (SEM) image of a surface of a resin insulation layer of the multilayer wiring board.
Figure 11:
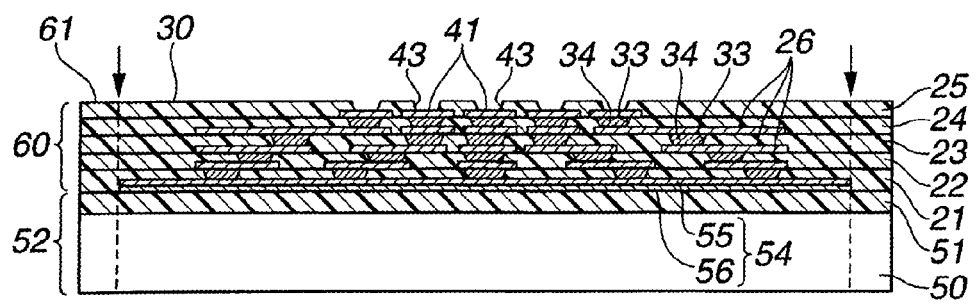
FIGS. 11 to 14 are schematic views showing process steps for manufacturing the multilayer wiring board according to the one embodiment of the present invention.

As shown in FIG. 10, the amount of the filler at the top surface of the resin insulation layer 25 can be estimated by taking a SEM picture 59 of the top surface of the resin insulation layer 25, drawing a diagonal line L1 on the SEM picture 59 and measuring the total length of the filler particles 57 in the diagonal line L1 (i.e. the sum of the widths of the filler particles 57 overlapping the diagonal line L1). It is confirmed by comparison of the measurement results before and after the filler reducing step that the amount of the filler particles 57 present at the top surface of the resin insulation layer 25 is equal to that inside of and at the bottom surface of the resin insulation layer 25 before the filler reducing step and is lower than that inside of and at the bottom surface of the resin insulation layer 25 after the filler reducing step.

Further, the contact angle of the underfill material 49 relative to the top surface of the resin insulation layer 25 is adopted as a measure of the flowability of the underfill material 49 on the top surface of the resin insulation layer 25. The smaller the contact angle, the easier the underfill material 49 will conform to and spreads and flows over the top surface of the resin insulation layer 25.

Actual measurements were carried out to verify the filler reduction effect of the high-pressure water cleaning treatment in the filler reducing step of the present embodiment. Before the filler reducing step, the amount of the filler particles 57 present at the top surface of and inside of the resin insulation layer 25 was about 83%; and the contact angle of the underfill material 49 relative to the top surface of the resin insulation layer 25 was about 24°. On the other hand, the amount of the filler particles 57 present at the top surface of the resin insulation layer 25 was reduced to about 37%; and the contact angle of the underfill material 49 relative to the top surface of the resin insulation layer 25 was reduced to about 11° after the filler reducing step.

Further measurements was carried out by varying various conditions of the high-pressure water cleaning treatment (such as the pressure, temperature and ejection time of the high-pressure water W1) and thereby adjusting the amount of the filler present at the outer surface of the outer resin insulation layer 25 after the filler reducing step. As a result, it has been found that it is preferable that the amount of the filler present at the outer surface of the outer resin insulation layer 25 after the filler reducing step is in a range of about 30% to about 70% in order to improve the flowability of the underfill material 49 to a favorable level that does not cause voids in the clearance between the outer resin insulation layer 25 and the IC chip 12. The contact angle of the underfill material 49 relative to the outer surface of the outer resin insulation layer 25 was about 10° to about 20° when the amount of the filler present at the outer surface of the outer resin insulation layer 25 was in such a preferable range.

Alternative effective way of the cleaning treatment is ultrasonic cleaning using ultrasonic wave. It is feasible to combine the ultrasonic cleaning with the high-pressure water cleaning, i.e., clean the top surface of the outer resin insulation layer 25 with high-pressure water while allowing ultrasonic wave to propagate through the high-pressure water.

Another alternative effective way of the cleaning treatment is alkaline cleaning. It is feasible to combine the alkaline cleaning with either or both of the high-pressure water cleaning and the ultrasonic cleaning. The combination of the alkaline cleaning and the high-pressure water cleaning and/or ultrasonic cleaning enables simultaneous physical and chemical treatments to increase the filler reduction effect of the cleaning treatment.

By the ultrasonic cleaning or alkaline cleaning treatment, the amount of the filler particles 57 present (remaining) and exposed at the top surface of the outer resin insulation layer 25 can be thus reduced efficiently to a lower level than the amount of the filler particles 57 present (remaining) inside of and at the bottom surface of the outer resin insulation layer 25 in the same manner as above by the high-pressure water cleaning treatment.

In the filler reducing step, the filler particles 57 exposed at the wall surfaces of the holes 43 are also reduced by the cleaning treatment. As mentioned above, the holes 43 are formed by laser processing in the outer resin insulation layer 25 so that the amount of the filler particles 57 protruding from the wall surfaces of the holes 43 is made lower than the amount of the filler particles 57 protruding from the top surface of the outer resin insulation layer 25 during the hole forming step. The amount of the filler particles 57 washed away from the top surface of the outer resin insulation layer 25 in the filler reducing step is thus higher than the amount of the filler particles 57 washed away from the wall surfaces of the holes 43 in the filler reducing step. That is, the amount of the filler particles 57 present (remaining) and exposed at the top surface of the outer resin insulation layer 25 after the filler reducing step is lower than the amount of the filler particles 57 present (remaining) at the wall surfaces of the holes 43 after the filler reducing step; and the amount of the filler particles 57 present (remaining) at the wall surfaces of the holes 43 after the filler reducing step is lower than the amount of the filler particles 57 present (remaining) inside of and at the bottom surface of the outer resin insulation layer 25.

It is preferable that the ratio of the number of the recesses 58 formed in the top surface of the outer resin insulation layer 25 by the removal of the filler particles 57 to the number of the filler particles 57 remaining and exposed at the top surface of the outer resin insulation layer 25 is 50% or higher. It is possible to secure the sufficient flowability of the underfill material 49 on the top surface of the outer resin insulation layer 25 when the recesses 58 are formed at such a ratio by the removal of the filler particles 57 from the top surface of the outer resin insulation layer 25.

In addition, not only the filler but also any foreign matter (such as resin chippings) adhering to the surface of the outer resin insulation layer 25 and the wall surfaces of the holes 43 can be removed by the cleaning treatment in the filler reducing step.

After the filler reducing step, the resin insulation layers 21 to 25 are cured by heat and pressure treatment in the thermal curing step. It is feasible to cure the resin insulation layers 21 to 25 to a certain degree at each layer formation and cure the resin insulation layers 21 to 25 completely in the thermal curing step.

If the thermal curing step is performed before the filler reducing step, the filler particles 57 are fixed by curing of the outer resin insulation layer 25 and thus are difficult to clean from the top surface of the outer resin insulation layer 25 by the cleaning treatment. In the present embodiment, however, the filler reducing step is performed before the thermal curing step. As the outer resin insulation layer 25 is yet completely cured and is relatively soft at the time of the filler reducing step, it is possible to reduce the amount of the filler particles 57 present at the top surface of the outer resin insulation layer 25 certainly and assuredly in the filler reducing step.

By the above build-up process, there can be obtained a wiring laminate 60 in which the laminated metal sheet 54, the resin insulation layers 21 to 25 and the conduction layers 26 are laminated on the substrate medium 52. Herein, the portion of the wiring laminate 60 located on the laminated metal sheet 54 corresponds to the laminated wiring portion 30 of the multilayer wiring board 11.

After that, the laminated wiring portion 30 is cut out from the wiring laminate 60 with a dicing machine. At this time, the laminate 60 and the substrate medium 52 (support substrate 50 and base coat layer 51) are cut simultaneously along the border between the laminated wiring portion 30 and its circumferential portion 61 so that the outer edge of the laminated metal sheet 54, which has been sealed by the resin insulation layer 21, becomes exposed. Upon removal of the circumferential portion 61 from the laminate 60, the contact between the resin insulation layer 21 and the base coat layer 51 is lost. The laminated wiring portion 30 is thus bonded to the substrate medium 52 only via the laminated metal sheet 54.

Figure 12:
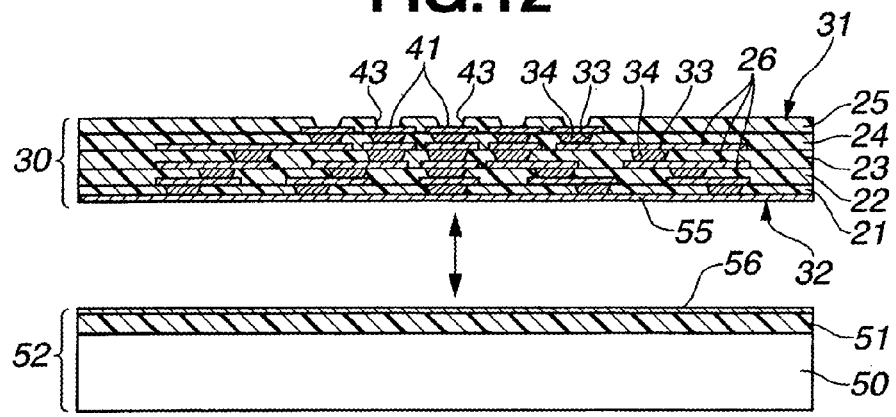
Figure 13:
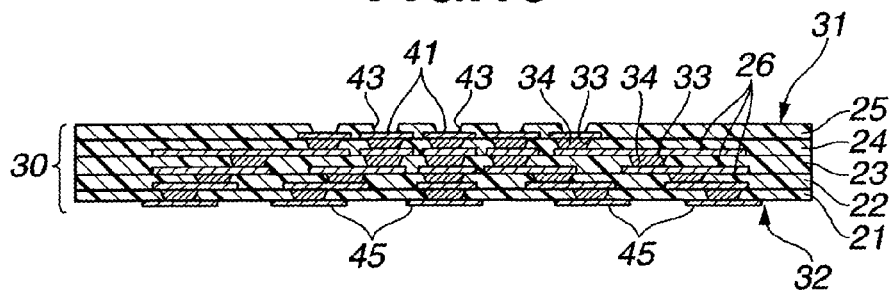

As shown in FIG. 12, the copper foil films 55 and 56 of the laminated metal sheet 54 are detached from each other to separate the laminated wiring portion 30 from the substrate medium 52 and allow the copper foil film 55 on the bottom surface 32 of the laminated wiring portion 30 (resin insulation layer 21) to become exposed. The copper foil film 55 is patterned by etching and formed into the connection terminals 45 on the resin insulation layer 21 as shown in FIG. 13.

Figure 14:
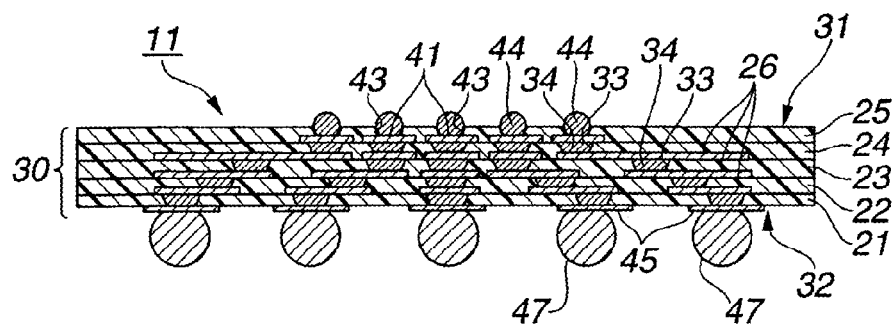

Subsequently, the solder bumps 44 are formed on the connection terminals 41 on the resin insulation layer 24 as shown in FIG. 14 by mounting solder balls on the connection terminals 41 with a solder ball mounting machine and reflowing the solder balls by heating at a given temperature. The solder bumps 47 are also formed on the connection terminals 45 on the resin insulation layer 21 in the same manner as above. With this, the multilayer wiring board 11 is completed.

The IC chip 21 is then mounted on the chip mounting area 29 of the multilayer wiring board 11 by aligning the surface contact terminals 28 of the IC chip 12 with the solder bumps 44 of the multilayer wiring board 11, reflowing the solder bumps 44 by heating and thereby joining the surface contact terminals 28 and the solder bumps 44 to each other.

Finally, the underfill material 49 of liquid curable resin is filled in the clearance between the outer resin insulation layer 25 and the IC chip 12. As mentioned above, the amount of the filler (filler particles 57) exposed at the top surface of the outer resin insulation layer 25, which causes resistance to the flow of the underfill material 49, has been reduced to improve the flowability of the underfill material 49 on the outer resin insulation layer 25 in the filler reducing step. It is therefore possible to fill the underfill material 49 efficiently throughout the clearance between the outer resin insulation layer 25 and the IC chip 12 so that the underfill material 49 can properly and assuredly seal the connection points in the clearance between the multilayer wiring board 11 and the IC chip 12 in a short time without causing voids in the clearance between the outer resin insulation layer 25 and the IC chip 12. The semiconductor package 10 is completed upon sealing the connection points between the multilayer wiring board 11 and the IC chip 12 by the underfill material 49 as shown in FIG. 1.

The entire contents of Japanese Patent Application No. 2010-165397 (filed on Jul. 22, 2010) are herein incorporated by reference.

Although the present invention has been described with reference to the above specific embodiment of the invention, the present invention is not limited to this exemplary embodiment. Various modification and variation of the embodiment described above will occur to those skilled in the art in light of the above teachings.

For example, the present invention can be embodied in a multilayer wiring board in which laminated wiring portions are formed with build-up layers on both sides of a core substrate although the multilayer wiring board 11 is provided with no core substrate in the above embodiment.

The conductor parts exposed through the holes 43 of the outer resin insulation layer 25 are not limited to the connection terminals 43 for electrical connection to the IC chip 21 and can be in any form without particular limitation, such as connection terminals for electrical connection to another electronic chip.

Figure 15:
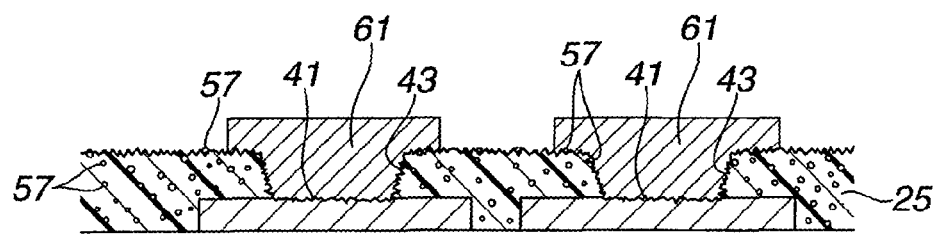
FIGS. 15 and 16 are schematic views showing process steps for manufacturing a multilayer wiring board according to another embodiment of the present invention.
Figure 16:
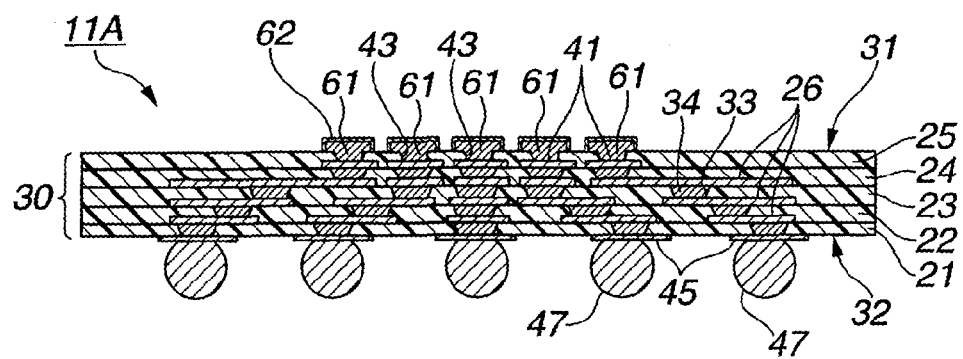

For example, the present invention can alternatively be embodied in a multilayer wiring board 11A as shown in FIGS. 15 and 16. The multilayer wiring board 11A is structurally the same as the multilayer wiring board 11, except the form of the conductive parts exposed through the holes 43 of the outer resin insulation layer 25 are columnar in shape so as to partially protrude from the top surface of the outer resin insulation layer 25.

More specifically, as shown in FIG. 15, the multilayer wiring board 11A has a plurality of connection terminals 41 arranged below the outer resin insulation layer 25 (as the solder resist) and a plurality of columnar terminals 61 such as copper posts formed by copper plating on the respective connection terminals 41 and each having a top (outer) surface coated with a nickel/gold plating film 62. In this case, the columnar terminals 61 correspond to the conductor parts.

The multilayer wiring board 11A can be manufactured by the following procedure. The build-up process up to the filler reducing and thermal curing steps is conducted in the same manner as above. After that, a plating film is applied by electroless copper plating to the whole of the top surface and holes 43 of the outer resin insulation layer 25. A dry film for lithographic application is laminated to the plating film and subjected to exposure and development, thereby forming a plating resist on the top surface of the outer resin insulation layer 25. In the state of the plating resist being applied, electrolytic copper plating is selectively performed on the top surface of the outer resin insulation layer 25. Then, the columnar terminals 61 are formed as shown in FIG. 15. After removal of the plating resist and the plating film, an etching resist is formed on the top surface of the outer resin insulation layer 25. The resulting wiring laminate 60 is cut with a dicing machine. Subsequently, the copper foil films 55 and 56 of the laminated metal sheet 54 are detached from each other to separate the laminated wiring portion 30 from the substrate medium 52. The copper foil film 55 on the bottom surface 32 of the laminated wiring portion 30 is patterned by etching and formed into the connection terminals 45. The etching resist is removed. Electroless nickel plating and the electroless gold plating are successively applied to the columnar terminals 61 and the connection terminals 45 so that the nickel/gold plating films 62 are formed on each of the columnar terminals 61 and the connection terminals 45. With this, the multilayer wiring board 11A is completed.

Further, the conductive parts exposed through the holes 43 of the outer resin insulation layer 25 are not limited to those for electrical connection to the electronic chip but may be those for other purposes such as positioning of the multilayer wiring board 11 and the electronic chip.

The scope of the invention is defined with reference to the following claims.

What is claimed is:

1. A manufacturing method of a multilayer wiring board, the multilayer wiring board comprising a laminated wiring portion having a plurality of resin insulation layers and conduction layers alternately laminated on each other, the resin insulation layers including an outer resin insulation layer as the outermost layer of the laminated wiring portion and an inner resin insulation layer as the inner layer of the laminated wiring portion, the outer resin insulation layer being made of the same insulation resin material as the inner resin insulation layer, containing a filler of inorganic oxide and having an outer surface defining thereon a chip mounting area to which an electronic chip is mounted with an underfill material filled in a clearance between the outer resin insulation layer and the electronic chip and holes through which conductor parts are exposed, the amount of the filler present at the outer surface of the outer resin insulation layer being lower than the amount of the filler present inside of the outer resin insulation layer and being lower than the amount of the filler present at wall surfaces of the holes, the manufacturing method comprising:

a hole forming step of forming the holes in the outer resin insulation layer by laser processing;

a desmear treatment step of, after the hole forming step, removing smears from inside the holes of the outer resin insulation layer; and a filler reducing step of, after the desmear treatment step, reducing the amount of the filler exposed at the outer surface of the outer resin insulation layer.

2. The manufacturing method of the multilayer wiring board according to claim 1, wherein the conductor parts are connection terminals for connection to the electronic chip.

3. The manufacturing method of the multilayer wiring board according to claim 2, wherein the conductor parts are columnar terminals formed on the connection terminals so as to partially protrude from the outer surface of the outer resin insulation layer.

4. The manufacturing method of the multilayer wiring board according to claim 1, wherein the filler reducing step includes performing high-pressure water cleaning treatment on the outer surface of the outer resin insulation layer at a pressure of high-pressure water of 100 kgf/cm$^2$ or higher.

5. The manufacturing method of the multilayer wiring board according to claim 4, wherein the high-pressure water cleaning treatment is performed continuously for 1 minute or more at room temperature.

6. The manufacturing method of the multilayer wiring board according to claim 4, wherein the high-pressure water cleaning treatment is performed by allowing ultrasonic wave to propagate through the high-pressure water.

7. The manufacturing method of the multilayer wiring board according to claim 1, wherein the filler reducing step includes performing ultrasonic cleaning treatment on the outer surface of the outer resin insulation layer.

8. The manufacturing method of the multilayer wiring board according to claim 1, wherein the filler reducing step includes performing alkaline cleaning treatment on the outer surface of the outer resin insulation layer.

9. The manufacturing method of the multilayer wiring board according to claim 1, wherein the insulating resin material of the resin insulation layers contains a thermosetting resin as a main component; and wherein the manufacturing method further comprises, after the filler reducing step, a thermal curing step of curing the outer resin insulation layer by heat treatment.

10. The manufacturing method of the multilayer wiring board according to claim 1, wherein the filler is a silica filler.

11. A multilayer wiring board, comprising:

a laminated wiring portion having a plurality of resin insulation layers and conduction layers alternately laminated on each other, the resin insulation layers including an outer resin insulation layer as the outermost layer of the laminated wiring portion and an inner resin insulation layer as the inner layer of the laminated wiring portion, the outer resin insulation layer being made of the same insulating resin material as the inner resin insulation layer, containing a filler of inorganic oxide and having an outer surface defining thereon a chip mounting area to which an electronic chip is mounted, with an underfill material filled in a clearance between the outer resin insulation layer and the electronic chip, and holes through which conductor parts are exposed, wherein the amount of the filler present at the outer surface of the outer resin insulation layer is lower than the amount of the filler present inside of the outer resin insulation layer and is lower than the amount of the filler present at wall surfaces of the holes.

12. The multilayer wiring board according to claim 11, wherein the amount of the filler present at the wall surfaces of the holes is smaller than the amount of the filler present inside of the outer resin insulation layer.

13. The multilayer wiring board according to claim 11, wherein the ratio of the number of recesses formed in the outer surface of the outer resin insulation layer by removal of the filler to the number of the filler exposed at the outer surface of the outer resin insulation layer is 50% or higher.

14. The multilayer wiring board according to claim 11, wherein the filler is a silica filler.

15. The multilayer wiring board according to claim 12, wherein the conductor parts are connection terminals for connection to the electronic chip.

16. The multilayer wiring board according to claim 15, wherein the conductor parts are columnar terminals formed on the connection terminals so as to partially protrude from the outer surface of the outer resin insulation layer.

* * * * *